United States Patent [19]

Lucas

[11] Patent Number: 4,782,323
[45] Date of Patent: Nov. 1, 1988

[54] TECHNIQUE FOR MAINTAINING A COMMON CENTROID IN SWITCHED ELEMENT ANALOG-TO-DIGITAL CONVERTERS

[75] Inventor: Charles H. Lucas, Newport Beach, Calif.

[73] Assignee: Hughes Aircraft Company, Los Angeles, Calif.

[21] Appl. No.: 175,635

[22] Filed: Apr. 4, 1988

Related U.S. Application Data

[63] Continuation of Ser. No. 868,498, May 30, 1986, abandoned.

[51] Int. Cl.[4] .............................................. H03M 1/66
[52] U.S. Cl. ................................................... 341/150
[58] Field of Search ................................ 340/347 DA

[56] References Cited

U.S. PATENT DOCUMENTS 3,995,304 11/1976 Pease ........................... 340/347 DA
4,029,949 6/1977 Dew ............................. 340/347 DA

OTHER PUBLICATIONS

McCreary "IEEE Journal of Solid-State Circuits" vol. sc-10, No. 6, Dec. 1975, pp. 371-379.
Maddox "Electronics" Apr. 4, 1974 pp. 125-130.

Primary Examiner—Charles D. Miller
Attorney, Agent, or Firm—Kenneth W. Float; A. W. Karambelas

[57] ABSTRACT

A switched capacitor circuit for use in a digital-to-analog converter, an analog-to-digital converter, or other digitally controlled circuit is disclosed. The switched capacitor circuit includes first and second arrays (30, 40) of switched capacitors of substantially identical value, each capacitor having a switched terminal. The switched capacitor circuit further includes a decoding circuit (20) responsive to a digital input having a decimal value N for providing control signals for each of the capacitor arrays. Logic circuitry (33, 43, GC(I)) responsive to the control signals is included for sequentially switching the switched terminals of L and M capacitors respectively of the first and second switched capacitor arrays in a predetermined sequence so as to maintain the geometrical centroid of the switched capacitors at a substantially constant location, where the sum of L and M is equal to N.

9 Claims, 6 Drawing Sheets

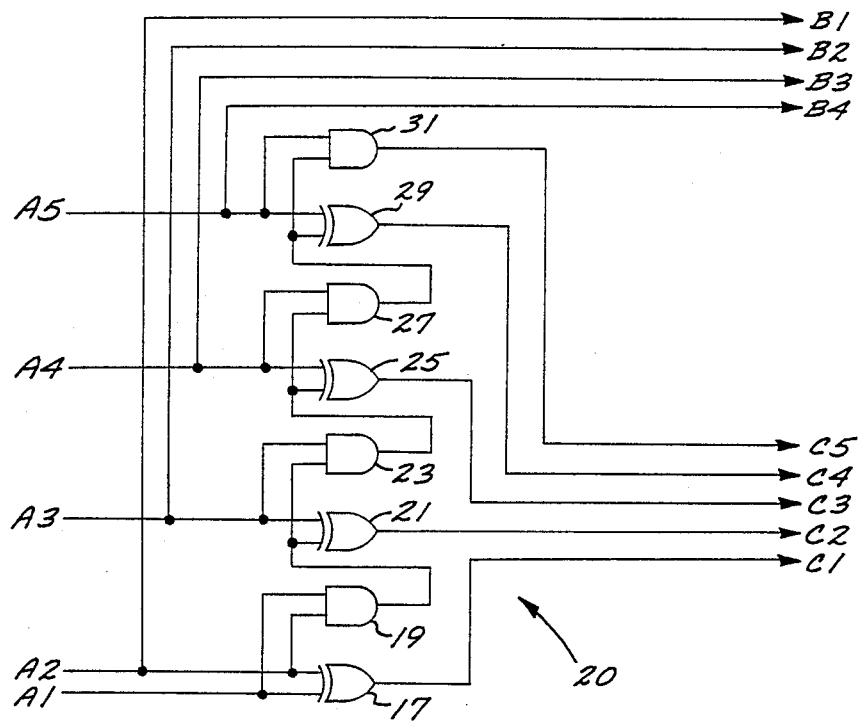
FIG. 3
FIG. 5
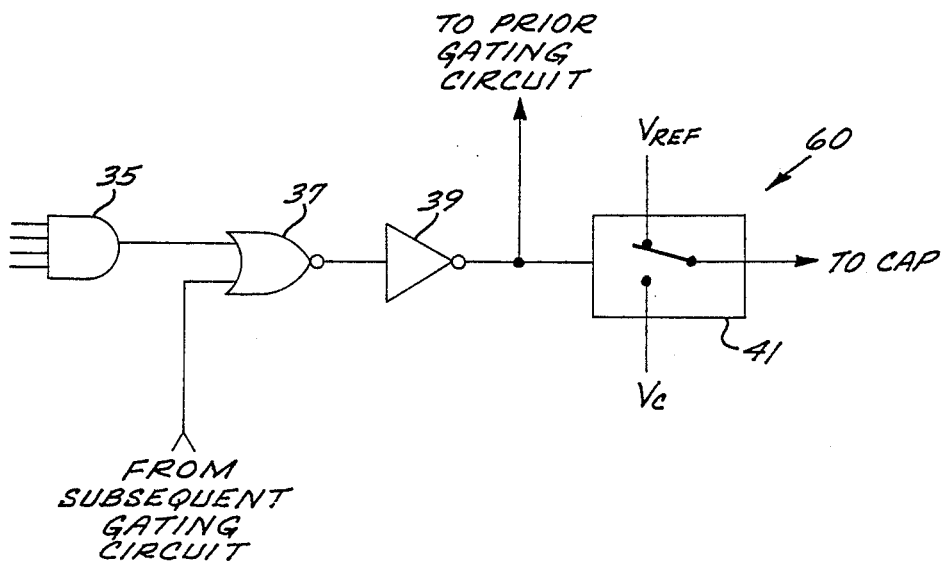

TECHNIQUE FOR MAINTAINING A COMMON CENTROID IN SWITCHED ELEMENT ANALOG-TO-DIGITAL CONVERTERS

CROSS REFERENCE TO RELATED APPLICATIONS

This application is a continuation of application Ser. No. 868,498, filed Mar. 30, 1986, now abandoned.

BACKGROUND OF THE INVENTION

The disclosed invention generally relates to digital-to-analog converters, and is particularly directed to a digital-to-analog converter having reduced sensitivity to first order integrated circuit processing variations and further having improved integral linearity.

Digital-to-analog converters are utilized to provide an analog signal, such as a voltage, as a function of a digital input. Digital-to-analog converters typically include binary weighted elements (e.g., capacitors, resistors, or current sources) which are selectively switched as a function of the digital input. However, such binary weighted elements need to be extremely precise and/or well matched to avoid integral non-linearity that would cause erroneous analog output signals.

In the processing of integrated circuits, first order processing variations result in nominally identical elements at different locations having different values. In digital-to-analog converters, such first order variations in the weighting elements (e.g., resistors, capacitors) causes integral non-linearity.

SUMMARY OF THE INVENTION

It would therefore be an advantage to provide a digital-to-analog converter which has reduced integral non-linearity.

It would also be an advantage to provide a digital-to-analog converter which has reduced sensitivity to integrated circuit processing variations.

Another advantage would be to provide a digital-to-analog converter which includes equal valued weighting elements and which has reduced integral non-linearity.

Still another advantage would be to provide a digital-to-analog converter which includes weighting elements of nominally equal value which are selectively switched to maintain the centroid of the switched elements at a substantially constant location.

The foregoing and other advantages and features are provided in a switched element circuit which includes a plurality of circuit elements of substantially identical value having a respective switchable terminals and being arranged in a predetermined layout. Logic circuitry responsive to a digital input signal having a value N provides a logic output signal indicative of the digital input signal. Gating circuitry responsive to the logic output signal sequentially switches the switchable terminals of a predetermined number of the circuit elements in a predetermined sequence to maintain the location of the geometrical centroid of the predetermined number of circuit elements at a substantially constant location, where the predetermined number is N. More specifically, the circuit elements, which may be capacitors, resistors or current sources, are arranged in rows and columns and are sequentially switched so as to substantially maintain the geometrical centroid of the switched elements at the geometrical centroid of the circuit elements as arranged in the rows and columns.

A further aspect of the invention is directed to a method for converting a digital input having a value N to an analog signal. The method includes the steps of (1) conditioning the digital input to provide a logic output indicative of the digital input, (2) selecting in response to the logic output a predetermined number of capacitors having substantially identical values, where the predetermined number is N, and (3) sequentially switching the selected capacitors so as to maintain the location of the geometrical centroid of the selected capacitors at a substantially constant location.

BRIEF DESCRIPTION OF THE DRAWING

The advantages and features of the disclosed invention will readily be appreciated by persons skilled in the art from the following detailed description when read in conjunction with the drawing wherein:

FIG. 3 is a schematic diagram of the decoding logic circuit of the digital-to-analog converter of FIG. 1.

FIG. 5 is a schematic circuit diagram of a gating circuit for use in the switched capacitor arrays of the digital-to-analog converter of FIG. 1.

DETAILED DESCRIPTION

Figure 1:
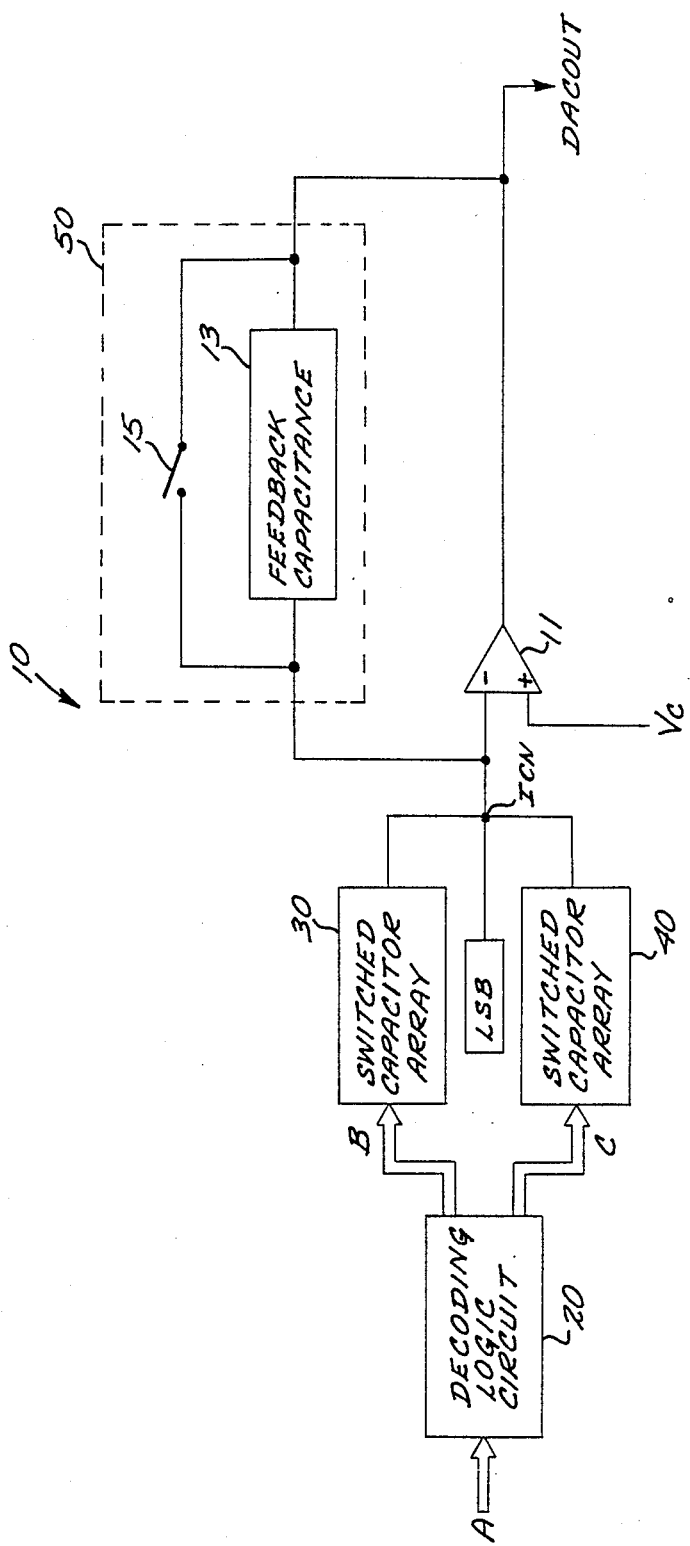
FIG. 1 is a block diagram of the disclosed digital-to-analog converter.

In the following detailed description and in the several figures of the drawing, like elements are identified with like reference numerals.

Referring now to FIG. 1, shown therein is a digital-to-analog converter 10 which includes a decoding logic circuit 20 for accepting a multi-bit parallel binary input signal A, which represents a digital value to be converted. The decoding logic circuit 20 decodes the input signal A to provide two parallel multi-bit outputs signals B and C. The specific characteristics of the signals A, B, and C will be discussed more specifically below relative to FIG. 2.

The D/A converter 10 further includes a first switched capacitor array 30 which accepts as an input the parallel signal B from the decoding logic circuit 20. The output of the switched capacitor array 30 is coupled to a node ICN. A second switched capacitor array 40 accepts as an input the parallel signal C from the decoding logic circuit 20. The output of the switched capacitor array 40 is also coupled to the node ICN.

Also coupled to the node ICN is an LSB capacitor LSB. The other terminal of the LSB capacitor may accept the output of a digital-to-analog converter (not shown) for the less significant bits of a binary number which includes the bits of the digital input A as a portion thereof.

The node ICN is coupled to the inverting input of an operational amplifier 11 which provides an analog output signal DACOUT which is the analog version of the parallel binary input A to the decoding logic circuit 20. A feedback circuit 50 is coupled between the output of the operational amplifier 11 and its inverting input. The feedback circuit 50 includes a feedback capacitance 13 and a reset switch 15 in parallel therewith. The non-inverting input of the operational amplifier 11 is coupled to a common voltage $V_C$, which may be ground.

Figure 2:
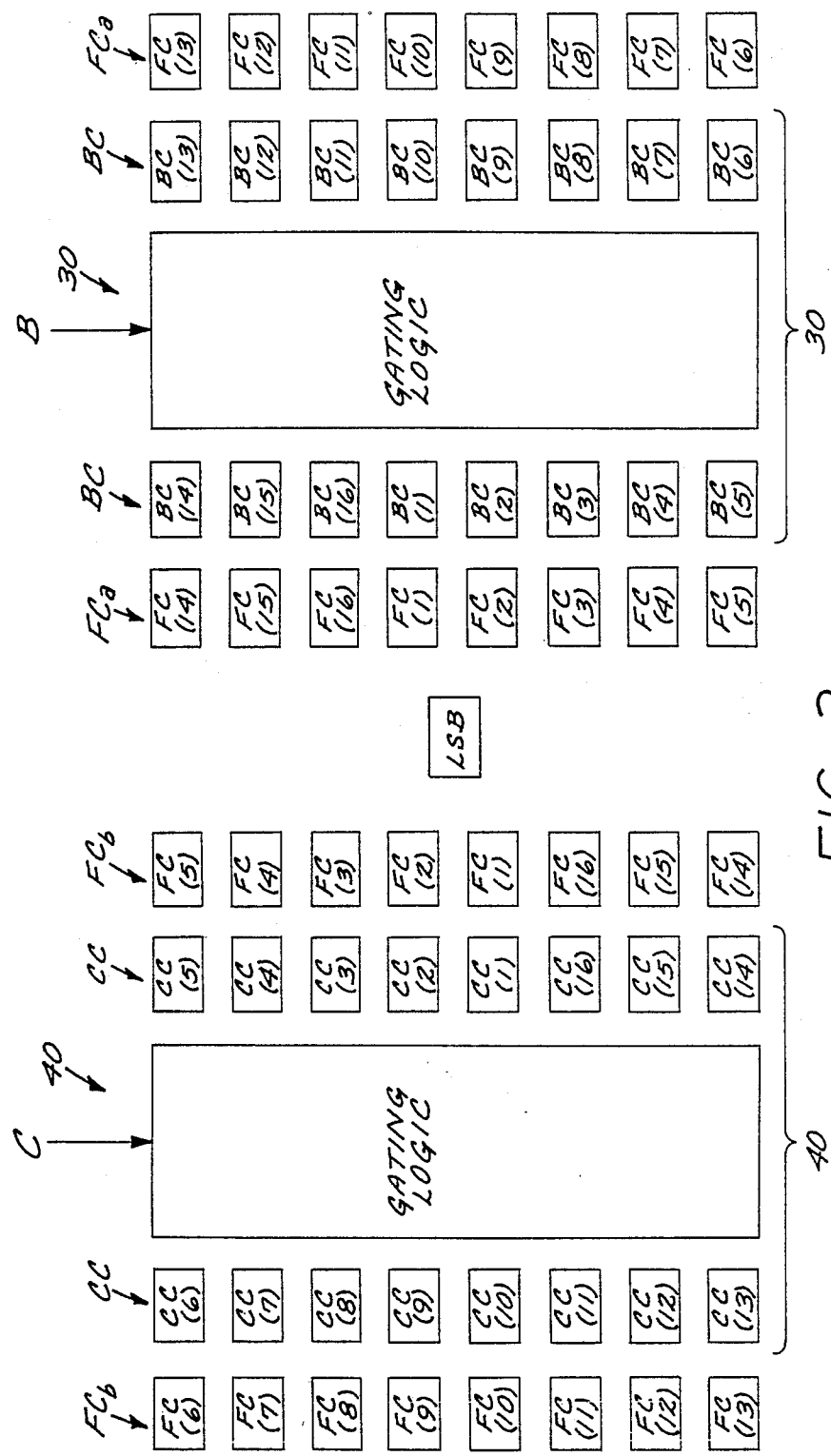
FIG. 2 is schematic diagram illustrating the respective locations of the switched capacitors of the switched capacitor arrays of FIGS. 4 and 6.

Preferably, the feedback capacitance 13, the switched capacitor arrays 20, 30, and the LSB capacitor are implemented with integrated circuit techniques, and FIG. 2 is a schematic top plan view of the layout of such elements. Specifically, each of the switched capacitor arrays 20, 30 includes a gating logic array (discussed further herein relative to FIGS. 4, 5, and 6) for selectively switching the switched capacitors BC and CC of the respective arrays. The gating logic arrays are respectively controlled by the digital signals B and C provided by the decoding logic circuit 20 (FIG. 1).

The switched capacitor array 30 includes sixteen (16) switched capacitors BC(1) through BC(16) arranged in two columns of eight (8) capacitors each. The columns are both identified with the referenced BC, and the capacitors are identified with sequential numbers. On either side of the switched capacitors BC and respectively adjacent to them are sixteen feedback capacitors FC(1) through FC(16) arranged in two columns of eight capacitors each. The columns are both identified with the reference $FC_a$. The feedback capacitors are identified with sequential numbers, and comprise one-half of the feedback capacitance 13 (FIG. 1).

The switched capacitor array 40 includes sixteen (16) switched capacitors CC(1) through CC(16) arranged in two columns of eight (8) capacitors each. The columns are both identified with the reference CC, and the capacitors are identified with sequential numbers. On either side of the switched capacitors CC and respectively adjacent them are sixteen feedback capacitors FC(1) through FC(16) arranged in two columns of eight capacitors each. The columns are both identified with the reference $FC_b$. The feedback capacitors are identified with sequential numbers, and comprises one-half of the feedback capacitance 13 (FIG. 1).

The switched capacitors and the feedback capacitors are further arranged in rows. Selected ones of the switched capacitors are "switched in" or activated as a function of the respective values of the parallel signals B and C, as more fully discussed herein. The physical layout or arrangement of the switched capacitors in columns and rows and the switching sequencing, to be described further herein, cooperate to maintain the geometric centroid of the activated switched capacitors at a substantially constant location.

The LSB capacitor is located diagonally between the capacitor BC(1) of the array 30 and the capacitor CC(1) of the array 40. The location of the LSB capacitor substantially corresponds to the geometrical centroid of the combined array formed by the two switched capacitor array 30, 40. Further, the location of the LSB capacitor also substantially corresponds to the geometrical centroid of the activated switched capacitors of the arrays 30, 40.

Referring now to FIG. 3, shown therein is a schematic circuit diagram of the decoding logic circuit 20. The parallel binary input A to the decoding logic circuit 20 particularly includes five bits A1, A2, A3, A4, A5, wherein A1 is the least significant bit and A5 is the most significant bit.

The parallel output B of the encoding logic circuit 20 includes four bits B1, B2, B3, B4, wherein B1 is the least significant bit and B4 is the most significant bit.

The bit B1 is provided by the bit A2 of the input A; the bit B2 is provided by the bit A3 of the input A; the bit B3 is provided by the bit A4 of the input A; and the bit B4 is provided by the bit A5 of the input A. Effectively, the output B corresponds to the input A with the least significant bit A1 being ignored.

The parallel output C of the encoding logic circuit 20 includes five bits C1, C2, C3, C4, C5, wherein C1 is the least significant bit and C5 is as the most significant bit. The bit C1 is provided by an exclusive OR gate 17 which accepts as inputs the bits A1 and A2, which are also provided to an AND gate 19. The output of the AND gate 19 and the bit A3 are inputs to an exclusive OR gate 21 which provides the bit C2 as its output.

The output of the AND gate 19 and the bit A3 are further provided as inputs to an AND gate 23. The output of the AND gate 23 and the bit A4 are inputs to an exclusive OR gate 25 which provides the bit C3 as its output.

The output of the AND gate 23 and the bit A4 are further provided as inputs to an AND gate 27. The output of the AND gate 27 and the bit A5 are inputs to an exclusive OR gate 29 which provides the bit C4 as its output.

The output of the AND gate 27 and the bit A5 are further provided as inputs to an AND gate 31. The output of the AND gate 31 is the bit C5.

The respective parallel signals A, B, C have decimal values (i.e., base 10) identified as $N_A$, $N_B$, $N_C$. The following Table I sets forth the decimal values $N_B$ and $N_C$ for the parallel outputs B and C for the decimal values $N_A$ of the parallel input A.

TABLE I

| $N_A$ | $N_B$ | $N_C$ |
|---|---|---|
| 0 | 0 | 0 |
| 1 | 0 | 1 |
| 2 | 1 | 1 |
| 3 | 1 | 2 |
| 4 | 2 | 2 |
| 5 | 2 | 3 |
| 6 | 3 | 2 |
| 7 | 2 | 4 |
| 8 | 4 | 4 |
| 9 | 4 | 5 |
| 10 | 5 | 5 |
| 11 | 5 | 6 |
| 12 | 6 | 6 |
| 13 | 6 | 7 |
| 14 | 7 | 7 |
| 15 | 7 | 8 |
| 16 | 8 | 8 |
| 17 | 8 | 9 |
| 18 | 9 | 9 |
| 19 | 9 | 10 |
| 20 | 10 | 10 |
| 21 | 10 | 11 |
| 22 | 11 | 11 |
| 23 | 11 | 12 |
| 24 | 12 | 12 |
| 25 | 12 | 13 |
| 26 | 13 | 13 |
| 27 | 13 | 14 |
| 28 | 14 | 14 |
| 29 | 14 | 15 |
| 30 | 15 | 15 |
| 31 | 15 | 16 |

For later discussion, it would be useful to note that for a given value of $N_A$, the sum of the corresponding values of $N_B$ and $N_C$ equals $N_A$.

Figure 4:
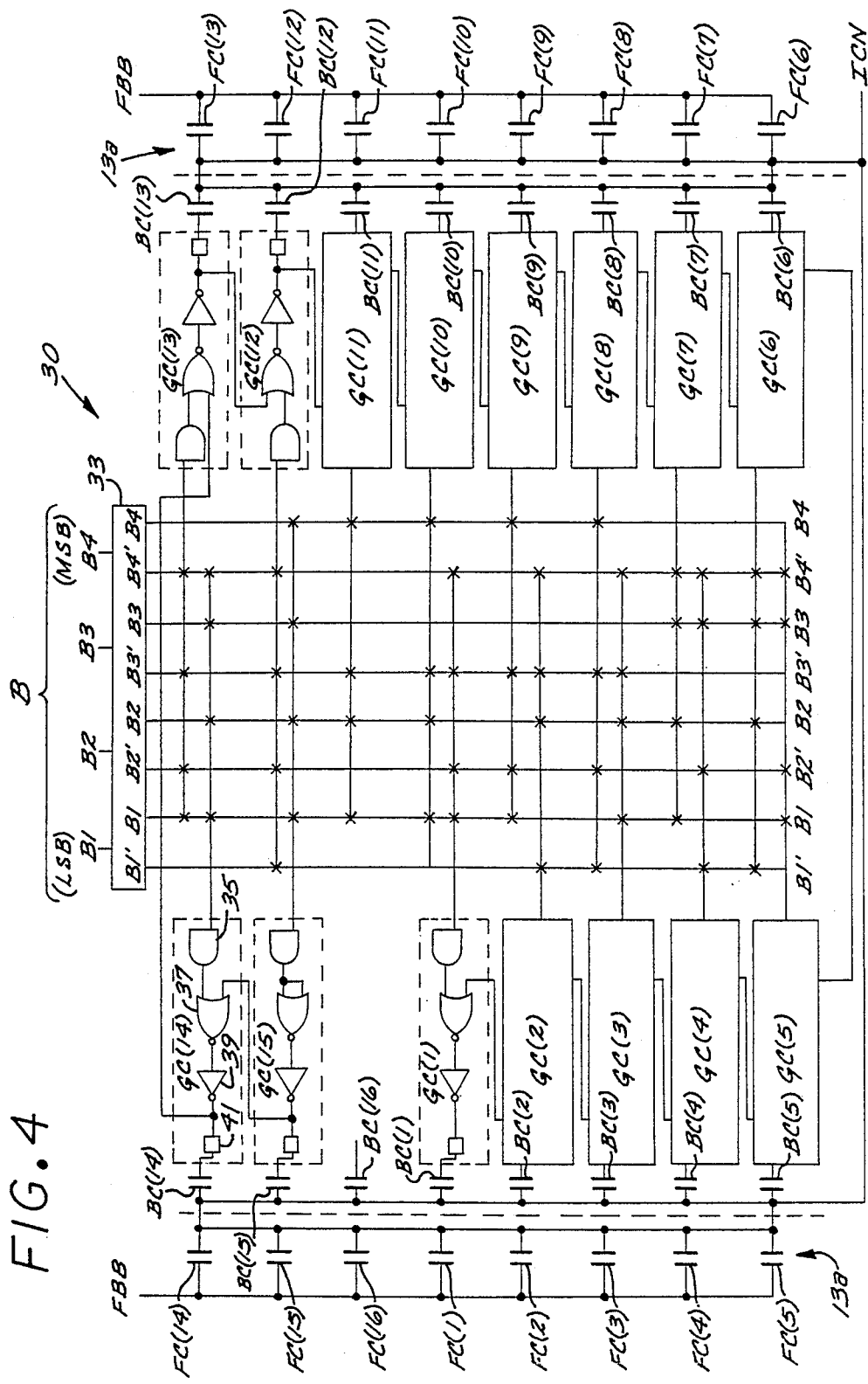
FIG. 4 is a partial schematic diagram of one of the switched capacitor arrays of the digital-to-analog converter of FIG. 1.

Referring now to FIG. 4, shown therein is a partial schematic diagram of a partial feedback capacitance 13a which comprises a portion of the feedback capacitance 13 (FIG. 1) and the switched capacitor array 30 which includes a logic network 33 for accepting as a parallel input the parallel binary output B of the decoding logic circuit 20. As discussed above, the parallel signal B includes four parallel bits B1, B2, B3, B4, wherein B1 is the least significant bit and B4 is the most significant bit. As also discussed above, the four bits B1, B2, B3, B4 of the parallel signal B are referenced as having a decimal value $N_B$. The outputs of the logic network 33 are the input bits B1, B2, B3, B4 and their complements; namely, B1', B2', B3', B4'. The outputs of the logic network 33 are respectively represented by vertical line segments identified by respective signal names (e.g., B1', B1, B2' etc.).

The switched capacitor array 30 further includes switched capacitors BC(1) through BC(16), which are all of substantially identical value C. As discussed above relative to FIG. 2, the switched capacitors BC(1) through BC(16) are arranged in rows and columns which represent the relative locations of the switched capacitors. Thus, the switched capacitors BC(2) through BC(5) and BC(14) through BC(16) are in one column; and the switched capacitors BC(6) through BC(13) are in another column. Further, the switched capacitors BC(13) and BC(14) form a row along with the switched capacitors CC(5) and CC(6) of the switched capacitor array 40, discussed further herein relative to FIG. 6.

In practice, the switched capacitor BC(16) is not utilized and may be eliminated. However, the locations of the switched capacitors BC(1) through BC(15) must be as shown in FIG. 2.

Each of the switched capacitors BC(1) through BC(15) has one terminal coupled to the node ICN which is coupled to the inverting input of the operational amplifier 11 (FIG. 1). The other terminals of the switched capacitors BC(1) through BC(15) are respectively coupled to respective gating circuits GC(1) through GC(15), each of which is of the general form shown in FIG. 4 and discussed further below.

The gating circuits GC(1) through GC(15) comprise a sequence beginning with GC(1) and continuing through GC(15). Thus, for example, GC(1) is prior to GC(2), while GC(3) is subsequent to GC(2). Similarly, the switched capacitors BC(1) through BC(15) shall be considered a sequence beginning with BC(1) and continuing through BC(15).

Each of the gating circuits GC(1) through GC(15) receives four predetermined multiple parallel inputs from the logic network 33, and the inputs to each gating circuit GC are schematically represented by a horizontal input line segment connected to such gating circuit. The actual input signals to a particular gating circuit GC are identified by x's at the intersections of the appropriate signal line segments with the input line segment. Thus, the parallel inputs to the gating circuit GC(1) for the switched capacitor BC(1) are B1, B2', B3', B4'.

The following Table II sets forth the inputs to the gating circuits GC(1) through GC(15).

TABLE II

| GC(1) | B1  | B2' | B3' | B4' |
| GC(2) | B1' | B2  | B3' | B4' |
| GC(3) | B1  | B2  | B3' | B4' |

TABLE II-continued

| GC(4)  | B1' | B2' | B3  | B4' |
| GC(5)  | B1  | B2' | B3  | B4' |
| GC(6)  | B1' | B2  | B3  | B4' |
| GC(7)  | B1  | B2  | B3  | B4' |
| GC(8)  | B1' | B2' | B3' | B4  |
| GC(9)  | B1  | B2' | B3' | B4  |
| GC(10) | B1  | B2  | B3' | B4  |
| GC(11) | B1  | B2  | B3' | B4  |
| GC(12) | B1' | B2' | B3  | B4  |
| GC(13) | B1  | B2' | B3  | B4  |
| GC(14) | B1' | B2  | B3  | B4  |
| GC(15) | B1  | B2  | B3  | B4  |

The partial feedback capacitance 13a includes the capacitors FC(1) through FC(16) which are coupled in parallel between the node ICN and the node FBB. Each of such feedback capacitors has a capacitance value of C, the same as the switched capacitors BC(1) through BC(15). The feedback capacitors FC(1) through FC(15) are adjacent the switched capacitors BC(1) through BC(15), and the feedback capacitor FC(16) is adjacent the non-used switched capacitor BC(16). Thus, there is one more feedback capacitor than utilized switched capacitors. The extra feedback capacitor is for the LSB capacitor, as described further herein. The feedback capacitors FC(1) through FC(16) provide for a partial feedback capacitance of 16C which is one-half of the feedback capacitance 13.

Referring now to FIG. 5, shown therein is a gating circuit 60 which which may be utilized for each of the gating circuits GC(1) through GC(15) of the capacitor array 30. The gating circuit 60 includes a four input AND gate 35 which accepts as inputs predetermined signals from the logic network 33. The output of the AND gate 35 is provided as an input to a two input NOR gate 37. The other input to the NOR gate 37 is provided by a feedback signal from the subsequent gating circuit, except for the gating circuit GC(15) associated with the switched capacitor BC(15), for which there is no subsequent gating circuit. For the gating circuit GC(15), the other NOR gate input is also connected to the output of the AND gate 35, as shown in FIG. 3, whereby the NOR gate 37 functions as an inverter.

The output of the NOR gate 37 is provided to an inverter 39 which controls a switch circuit 41. The output of the switch circuit 41 is coupled to the associated switched capacitor. The switch circuit 41 couples the associated switched capacitor to a reference voltage $V_{ref}$ if the output of the inverter 39 is low. If the output of the inverter 39 is high, the switch circuit 41 couples the switched capacitor to the common voltage $V_c$.

The feedback signal to a prior gating circuit, if any, is provided by the output of the inverter 39. As shown in the array 30 of FIG. 3, no feedback is required from the gating circuit GC(1) for the switched capacitor C(1).

It should be noted that the specific circuitry of the gating circuit GC(15) for the array 30 can be alternatively structured since it does not receive any feedback signal. Specifically, the AND gate 35 and the NOR gate 37 may be replaced by a four input NAND gate. For integrated circuit implementation, such use of a NAND gate could reduce the utilized chip area.

With the foregoing switched capacitor array 30 and gating circuit 60, the AND gate 35 of each of the gating circuits GC(1) through GC(15) will provide a high output only pursuant to a particular combination of input bits B1, B2, B3, B4, where such combination is unique for each the the gating circuits. Effectively, each of the AND gates 35 of the gating circuits GC(1) through GC(15) functions as an address decoder and is responsive only to its own unique address as defined by the connection of its inputs to the outputs of the logic network 33.

As is evident from Table I, the reference number J of a gating circuit GC(J) corresponds to the decimal value of its address as defined by the parallel binary inputs B1, B2, B3, B4. A gating circuit GC(J) which is addressed by the logic output of the logic network 33 is activated to cause the switched terminal of its associated switched capacitor BC(J) to be switched from the reference voltage $V_{ref}$ to the common voltage $V_c$.

While the overall operation of the D/A converter 10 will be more fully described further herein, it would be helpful to understand the operation of the switched capacitor array 30. Prior to conversion, the switched terminals of the switched capacitors BC(1) through BC(15) are all coupled to the reference voltage $V_{ref}$, which can be accomplished by setting all the bits of the input A to the encoding logic circuit 20 to low. The input A is then set to the value to be converted, and the process of conversion begins. If the decimal value $N_A$ of the input A is greater than 1, then the parallel input B to the switched capacitor array 30 will be non-zero and have a decimal value $N_B$. Pursuant to the parallel input B, the switched terminals of $N_B$ switched capacitors are switched from the reference voltage $V_{ref}$ to the common voltage $V_c$. Such $N_B$ capacitors include the capacitor BC($N_B$) and any prior capacitors up to and including the capacitor C(1).

However, not all $N_B$ switched capacitors are switched simultaneously. The capacitor BC($N_B$) is first switched, then the BC($N_B-1$) capacitor is switched, and so forth. Specifically, the addressed gating circuit GC($N_B$) is activated by the output of the logic network 33 so that the output of the AND gate 35 goes high. The output of the NOR gate 37 then goes low, and the output of the inverter 39 goes high. Pursuant to the high output of the inverter 39, the switch 41 couples the switched terminal of the capacitor BC($N_B$) to the common voltage $V_c$.

Since the output of the inverter 39 of the addressed gating circuit GC($N_B$) goes high, the output of the NOR gate 41 of the prior gating circuit GC($N_B-1$) goes high, causing the switched terminal of its associated switched capacitor BC($N_B-1$) to be switched to the common voltage $V_c$.

It should therefore be readily evident that the prior switched capacitors BC(I), where I is an integer less than $N_B$, are sequentially switched up and including BC(1).

Figure 6:
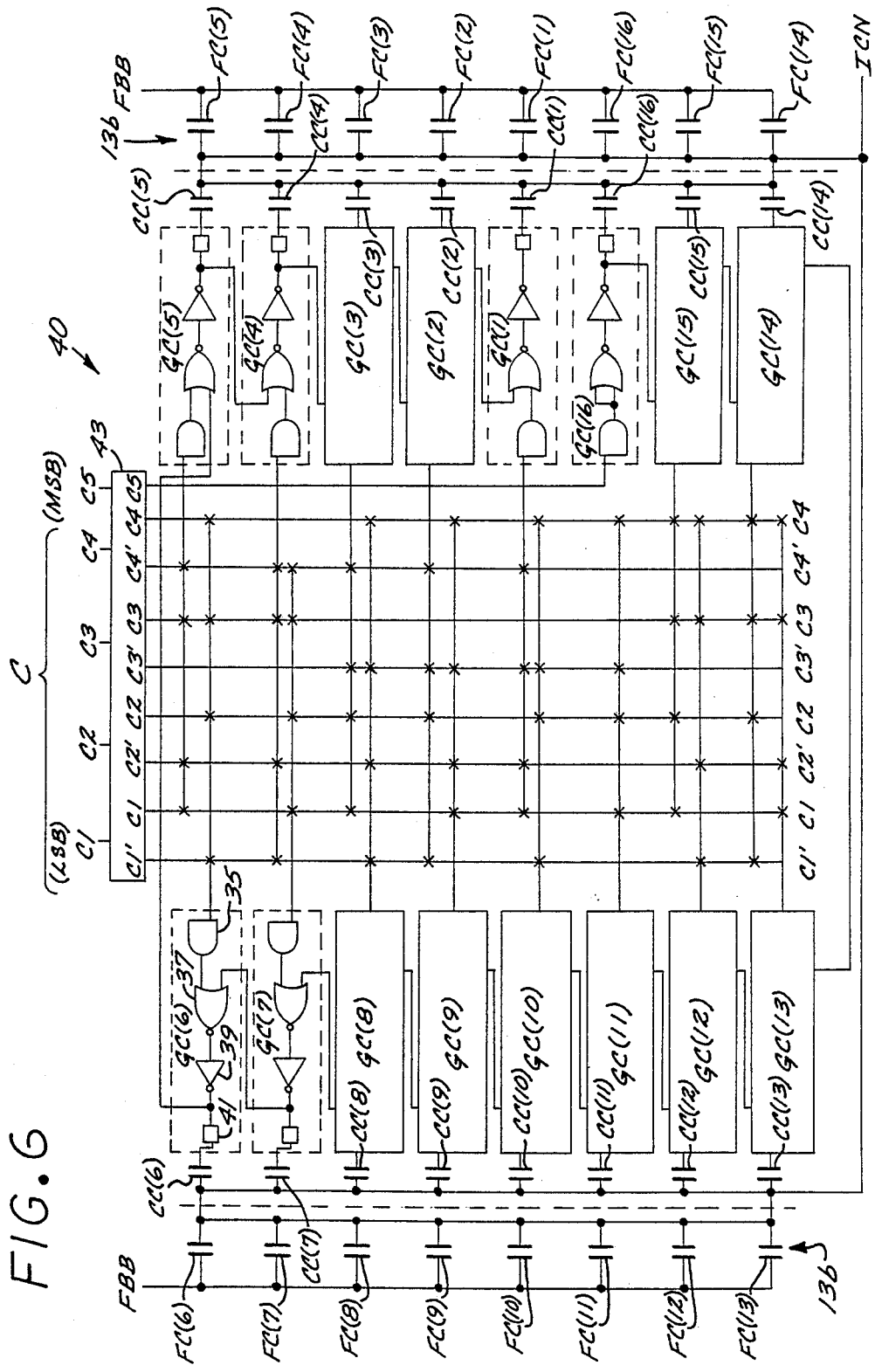
FIG. 6 is a partial schematic diagram of the other switched capacitor array of the digital-to-analog converter of FIG. 1.

Referring now to FIG. 6, shown therein is a partial schematic diagram of a partial feedback capacitance 13b which comprises a further portion of the feedback capacitance 13 (FIG. 1) and the switched capacitor array 40 which includes a logic network 43 for accepting as an input the parallel binary output C of the decoding logic circuit 20. As discussed above, the parallel signal C includes five parallel bits C2, C2, C3, C4, C5, wherein C1 is the least significant bit and C5 is the most significant bit. As also discussed above, the five bits C1, C2, C3, C4, C5 of the parallel signal C are referenced as having a decimal value $N_C$.

The outputs of the logic network 43 are the input bits C1, C2, C3, C4, C5 and the complements of the four least significant bits; namely, C1', C2', C3', C4'. The outputs of the logic network 43 are respectively represented by vertical line segments identified by respective signal names (e.g., C1', C1, C2', etc.).

The switched capacitor array 40 further includes switched capacitors CC(1) through CC(16), which are all of substantially identical value C. As discussed above relative to FIG. 2, the switched capacitors CC(1) through CC(16) are arranged in rows and columns which represent the relative locations of the switched capacitors. Thus, the switched capacitors CC(1) through CC(5) and CC(14) through CC(16) are in one column; and the switched capacitors CC(6) through CC(13) are in another column. Further, the switched capacitors CC(5) and CC(6) form a row along with the switched capacitors BC(13) and BC(14) of the switched capacitor array 30, discussed above relative to FIG. 4.

Each of the switched capacitors CC(1) through CC(16) has one terminal coupled to the node ICN which is coupled to the inverting input of the operational amplifier 11 (FIG. 1). The other terminals of the switched capacitors CC(1) through CC(16) are respectively coupled to respective gating circuits GC(1) through GC(16), each of which is of the general form shown in FIG. 5 and discussed above.

The gating circuits GC(1) through GC(16) comprises a sequence beginning with GC(1) and continuing through GC(16). Thus, for example, GC(1) is prior to GC(2), while GC(3) is subsequent to GC(2). Similarly, the switched capacitors CC(1) though CC(16) shall be considered a sequence beginning with CC(1) and continuing through CC(16).

Each of the gating circuits GC(1) through GC(15) receives four predetermined multiple parallel inputs from the logic network 43, and the inputs to each gating circuit GC are schematically represented by a horizontal input line segment connected to such gating circuit. The actual input signals to a particular gating circuit GC are identified by x's at the intersections of the appropriate signal line segments with the input line segment. Thus, the parallel inputs to the gating circuit GC(1) for the switched capacitor CC(1) are C1, C2', C3', C4'.

As particularly shown in FIG. 6, the gating circuit GC(16) receives only one input; namely, the bit C5, which is provided to all inputs of the AND gate 35. Stated another way, the inputs of the AND gate 35 of the gating circuit GC(16) are tied together for accepting the input bit C5.

The following Table III sets forth the inputs to the gating circuits GC(1) through GC(16).

TABLE III

| | | | | |
|---|---|---|---|---|
| GC(1) | C1 | C2' | C3' | C4' |
| GC(2) | C1' | C2 | C3' | C4' |
| GC(3) | C1 | C2 | C3' | C4' |
| GC(4) | C1' | C2' | C3 | C4' |
| GC(5) | C1 | C2' | C3 | C4' |
| GC(6) | C1' | C2 | C3 | C4' |
| GC(7) | C1 | C2 | C3 | C4' |
| GC(8) | C1' | C2' | C3' | C4 |
| GC(9) | C1 | C2' | C3' | C4 |
| GC(10) | C1' | C2 | C3' | C4 |
| GC(11) | C1 | C2 | C3' | C4 |
| GC(12) | C1' | C2' | C3 | C4 |
| GC(13) | C1 | C2' | C3 | C4 |
| GC(14) | C1' | C2 | C3 | C4 |
| GC(15) | C1 | C2 | C3 | C4 |
| GC(16) | | | | | C5 |

The partial feedback capacitance 13b includes the capacitors FC(1) through FC(16) which are coupled in parallel between the node ICN and the node FBB. Each of such feedback capacitors has a capacitance value of C, the same as the switched capacitors CC(1) through CC(16). The feedback capacitors FC(1) through FC(16) are preferably adjacent the switched capacitors CC(1) through CC(16) and provide a partial feedback capacitance value of 16C. The partial feedback capacitance 13b and the partial feedback capacitance 13a (FIG. 4) together provide the feedback capacitance 13 of the D/A converter 10 of FIG. 1.

The gating circuits GC(1) through GC(16) of the switched capacitor array 40 are arranged similarly to the gating circuits CC(1) through CC(15) of the switched capacitor array 30 of FIG. 4. Particularly, each of the gating circuits GC(2) through GC(16) provides a feedback signal to the respective prior gating circuits GC(1) through GC(15). The feedback signal is provided by the output of the inverter 39 of the feeding gating circuit, and is received by the NOR gate 37 of the receiving gating circuit. As shown in FIG. 6, the gating circuit GC(1) does not provide a feedback signal, and the gating circuit GC(16) does not receive a feedback signal. Particularly, the inputs of the NOR gate 37 of the gating circuit GC(16) are tied together to receive the output of the NAND gate 35. The NOR gate 35, therefore, functions as an inverter.

It should be noted that the specific circuitry of the gating circuit GC(16) can be alternatively structured since it only receives one input (the bit C5) and does not receive any feedback signal. Specifically, the AND gate 35 may be replaced by a conductive wire or a short circuit. For integrated circuit implementation, the replacement of the AND gate 34 in the gating circuit GC(16) with a short circuit could reduce the utilized chip area.

In the switched capacitor array 40, the maximum decimal value for the input C is 16, which corresponds to the maximum decimal value of 31 for the input A. Thus, the fifteen switched capacitors C(1) through C(15) can be uniquely addressed by the four least significant bits C1, C2, C3, C4 of the input C, since for the first fifteen values of the input C, the bit C5 is zero. The sixteenth capacitor C(16) may be uniquely addressed with the most significant bit C5 which is high only when the decimal value of the input C is 16.

The gating circuits of the switched capacitor array 40 have been advantageously configured to utilize the fact that the input C has a maximum decimal value of 16. Particularly, four input AND gates are utilized instead of using five-input AND gates. Further, the AND gate 35 of the gating circuit GC(16) may be replaced with a short circuit so that the bit C5 is coupled to the tied inputs of the NOR gate 37.

With the foregoing switched capacitor array 40 and the characteristics of the input C, the AND gate 35 of each of the gating circuits GC(1) through GC(16) will provide a high output only pursuant to a particular combination of input bits C2, C2, C3, C4, C5, where such combination is unique for each of the gating circuits. Effectively, each of the AND gates 35 of the gating circuits GC(1) through GC(16) functions as an address decoder and is responsive only to its own unique address as defined by the connection of its inputs to the outputs of the logic network 43 or to the input bit C5.

As is evident from Table III, the reference number J of a gating circuit GC(J) corresponds to the decimal value of its address as defined by the parallel binary inputs C1, C2, C3, C4, C5. A gating circuit GC(J), which is addressed by the input C is activated to cause the switched terminal of its associated switched capacitor CC(J) to be switched from the referenced voltage $V_{ref}$ to the common voltage $V_c$.

The operation of the switched capacitor array 40 is similar to the operation of the switched capacitor array 30 of FIG. 4. Prior to conversion, the switched terminals of the switched capacitors CC(1) though CC(16) are coupled to the referenced voltage $V_{ref}$, which can be accomplished by setting all the bits of the input A to the encoding logic circuit 20 to low. The input A is then set to the value to be converted, and the process of conversion begins. If the decimal value $N_A$ of the input A is greater than 0, then the parallel input C to the switched capacitor array 40 will be non-zero and have a decimal value $N_C$. Pursuant to the parallel input C, the switched terminals of $N_C$ switched capacitors are switched from the reference voltage $V_{ref}$ to the common voltage $V_c$. Such $N_C$ capacitors include the switched capacitor CC($N_C$) and any prior switched capacitors up to and including the capacitor CC(1).

However, not all $N_C$ switched capacitors are switched simultaneously. The capacitor CC($N_C$) is first switched, then the CC($N_C-1$) capacitor is switched, and so forth. Specifically, the addressed gating circuit GC($N_C$) is activated by the output of the logic network 43 so that the output of the AND gate 35 goes high. The output of the NOR gate 37 then goes low, and the output of the inverter 39 goes high. Pursuant to the high output of the inverter 39, the switch 41 coupled the switched terminal of the capacitor CC($N_C$) to the common voltage $V_c$.

Since the output of the inverter 39 of the addressed gating circuit GC($N_C$) goes high, the output of the NOR gate 51 of the prior gating circuit GC($N_C-1$) goes high, causing the switched terminal of its associated switched capacitor CC($N_C-1$) to be switched to the common voltage $V_c$.

It should therefore be readily evident that the prior switched capacitors CC(I), where I is an integer less than $N_C$, are sequentially switched up and including CC(1).

Considering now both of the switched capacitor arrays 30, 40, the respective numbers of switched capacitors that are activated are determined by the values of the parallel signals B and C. The respective values of the parallel signals B and C are determined by the value of the digital input A. Specifically, as discussed above relative to Table I, the sum of corresponding values of B and C equals the corresponding value of the digital input A.

With the respective locations of the switched capacitors in the combined arrays 30, 40 and the above described switching sequences, the common geometrical centroid of the activated capacitors in the combined arrays is maintained close to the location of the LSB capacitor, as shown in FIG. 2.

Maintaining the geometrical centroid of the activated switched capacitors close to the same location provides the following advantages. The digital-to-analog converter 10 is less sensitive to first order variations in integrated circuit processing and particularly has improved integral linearity. Further, locating the LSB capacitor at the common centroid minimizes differential non-linearities caused by first order processing variations.

Referring again to FIG. 2, an alternative layout of the switched capacitors and feedback capacitors is to have to locate the feedback capacitors in four columns, with two columns being on either side of the capacitor arrays 30, 40. In this manner, the switched capacitors of the arrays 30, 40 can be closer together. Bringing the switched capacitor closer together further reduces the sensitivity of the digital-to-analog converter to first order variations in processing.

In the foregoing D/A converter 10, the feedback capacitance 13 is shown as having a value of 32C. With that feedback capacitance value, the output DACOUT of the D/A converter is as follows:

$$\text{DACOUT} = V_{ref} \times \frac{NC}{16C} \quad \text{(Eq. 1)}$$

As discussed previously $V_{ref}$ is a reference voltage, N is the number of capacitors having their switched terminals switched from $V_{ref}$ to the common voltage $V_c$, is the capacitance value of each of the switched and feedback capacitors, and 32 is the number of feedback capacitors.

It should be readily understood by persons skilled in the art that other capacitance values may be utilized for the feedback capacitance 13. With such other feedback capacitance values, the output of the D/A converter will be as follows, where $F_c$ is the value of the feedback capacitance:

$$\text{DACOUT} = V_{ref} \times \frac{NC}{F_c} \quad \text{(Eq. 2)}$$

Figure 7:
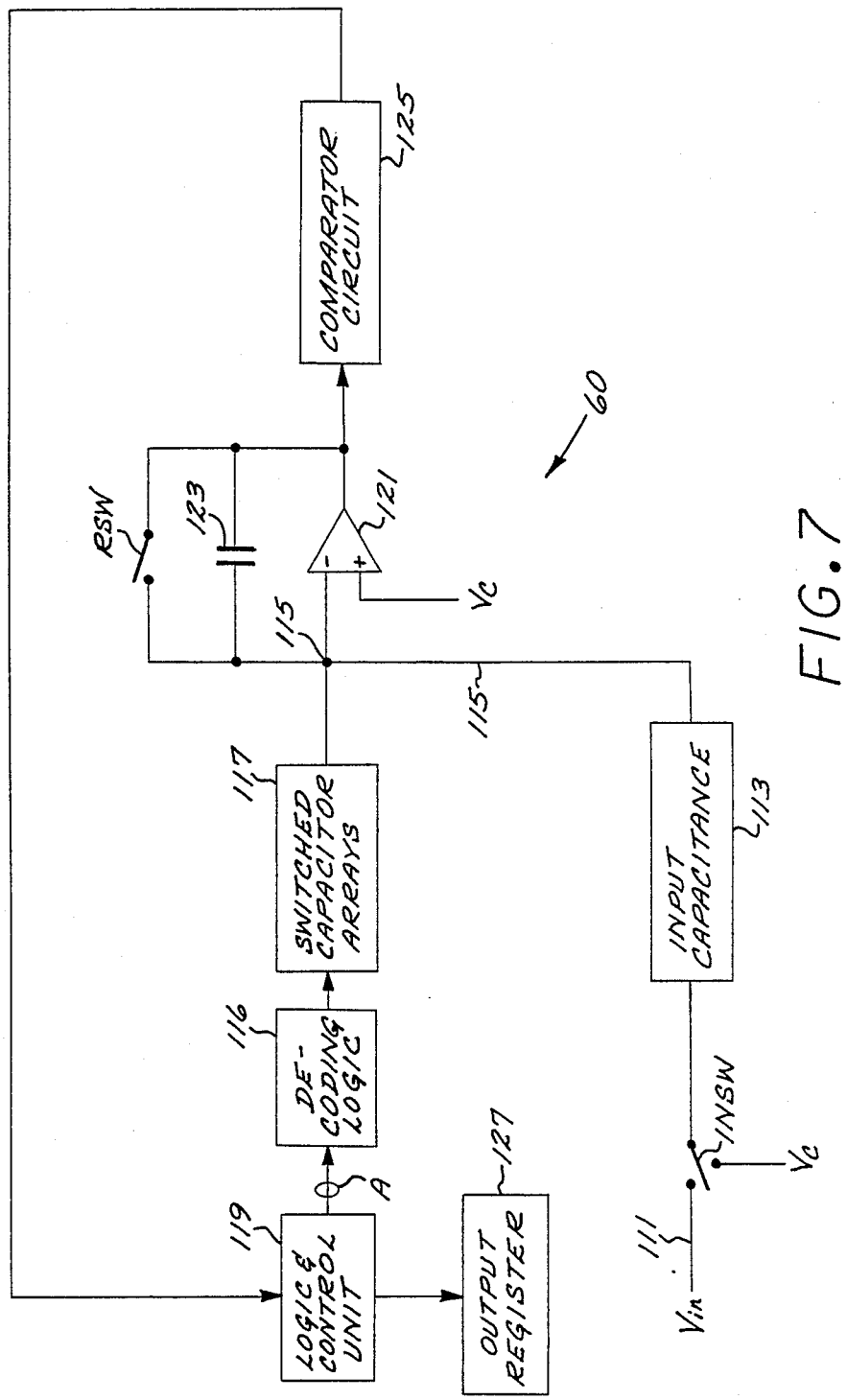
FIG. 7 is a block diagram illustrating the use of the disclosed digital-to-analog converter in an analog-to-digital converter.

Referring now to FIG. 7, shown therein is a block diagram of an analog-to-digital (A/D) converter 60 in which the decoding logic and switched capacitor arrays of the invention (discussed relative to FIGS. 2 through 6) may be advantageously utilized. The A/D converter 60 includes an input node 111 for accepting an input voltage $V_{in}$ which is to be converted. One node of an input capacitance 113 is selectively coupled to the input node 111 or to a common voltage $V_c$ by an input switch INSW. The common voltage $V_c$ may be ground. The other node of the input capacitance 113 is coupled to a node 115. Also coupled to the node 115 is the output of a switched capacitor array 117 which accepts inputs from a logic control unit 119.

The switched capacitor array 115 is substantially similar to the combined switched capacitor arrays 30, 40 shown in FIGS. 2, 4, and 6. Thus, a parallel binary input (corresponding to an input A) is provided by a logic and control unit 119 to a decoding logic circuit 116 which is substantially similar to the decoding logic 20 of FIG. 2. The decoding logic circuit 116 provides digital signals to the switched capacitor array 117. The output node ICN of the switched capacitor array 117 is coupled to the node 115.

With the use of the combined switched capacitor arrays 30, 40 the feedback capacitors (FC(1) through FC(16) in both arrays) may be advantageously utilized as the input capacitance 113 of the A/D converter 60 of FIG. 5. Specifically, the node FBB of the feedback capacitors would be coupled to the input switch INSW.

The node 115 is coupled to the inverting input of an operational amplifier 121 which has its non-inverting input coupled to the common voltage $V_c$. A feedback capacitor 123 and a reset switch RSW are coupled in parallel between the output and the inverting input of the operational amplifier 121. The output of the operational amplifier 121 is further coupled to a comparator circuit 125 which, for example, provides a comparison output indicating whether the operational amplifier output is less than or greater than a predetermined threshold level.

The comparison output of the comparator circuit 125 is provided to the logic and control circuit 119 which provides the binary input A to the decoding logic circuit 116. The logic and control unit 119 provides to an output register 127 a digital value indicative of the input voltage $V_{in}$.

The operation of the D/A converter 60 is in accordance with known D/A converters. A conversion cycle begins with the switch INSW coupled to the common voltage $V_c$, and the reset switch RSW closed. The reset switch RSW is then opened and the input switch INSW is coupled to the input node 111. The logic control unit periodically provides inputs to the decoding logic circuit 116 pursuant to a known technique, such as successive approximation. When the output of the operational amplifier 121 is sufficiently close to the predetermined threshold of the comparator circuit 125, an output is provided to the output register 127. Such output is based on the input to the decoding logic circuit 116 which resulted in the operational amplifier output that was sufficiently close to the threshold off the comparator circuit 125.

While capacitors have been disclosed as the switched elements in the foregoing D/A converter 10 and A/D converter 60, other elements such as substantially equal valued resistors or current sources may be utilized. For example, the switched capacitors and the feedback capacitors, which are of substantially equal value, may be replaced with resistors of substantially equal value. As still another alternative, the switched capacitors may be replaced with switched current sources of substantially equal value, and the feedback capacitors would not be utilized. The switched current sources would be controlled by respective gating circuits to provide respective current outputs in response to the activation of respective gating circuits. The outputs of the current sources would be coupled to the node ICN for summing.

Although the present invention has been discussed in connection with A/D and D/A converters, it may also be employed in other environments. For example, the concepts of the present invention may be employed in a digitally controlled amplifier, or multiplying D/A converter, or similar device wherein the reference voltage $V_{ref}$ is replaced by an input signal and wherein gain control is provided by the digital input signal A.

Although the foregoing has been a description and illustration of specific embodiments of the invention, various modifications and changes thereto can be made by persons skilled in the art without departing from the scope and spirit of the invention as defined by the following claims.

What is claimed is:

1. A circuit for use in digital-to-analog converters and analog-to-digital converters, said circuit comprising:
    a first array of capacitors having substantially identical value arranged in a predetermined layout, each capacitor in said first array having a switched terminal;
    a second array of capacitors having substantially identical value arranged in a predetermined layout, each capacitor in said second array having a switched terminal;

logic means responsive to a digital input signal having a value N for providing first and second logic control signals having values which when summed is equal to N; and gating logic means, including a plurality of switches individually connected to the switched terminals of the capacitors of said first and second arrays, for switching a respective predetermined number of capacitors in said first and second arrays in a predetermined sequence from first to second voltages as a function of said first and second logic control signals, said predetermined sequences and said predetermined layouts cooperating to maintain the geometrical centroid of the switched capacitors of said circuit at a substantially constant location.

2. The switched capacitor circuit of claim 1 wherein the geometrical centroid of the predetermined number of capacitors switched into said circuit substantially corresponds to the geometrical centroid of the first and second arrays of capacitors.

3. The switched capacitor circuit of claim 2 further comprising a capacitor corresponding to the least significant bit located at said geometrical centroid of the first and second arrays of capacitors.

4. The switched capacitor circuit of claim 1 wherein the first and second arrays of capacitors are arranged in rows and columns.

5. The switched capacitor circuit of claim 1 wherein the first and second arrays of capacitors are respectively arranged in first and second capacitor groups having the same number of columns.

6. The switched capacitor circuit of claim 5 wherein said logic means switches L capacitors of said first capacitor group into said circuit and the switches M capacitors of said second capacitor group into said circuit, where the sum of L and M equals said value N of said digital input signal.

7. The switched capacitor circuit of claim 5 wherein said logic means comprises:

decoding means responsive to said digital input signal for providing for each of said capacitor groups respective digital signals having respective values, the sum of which equals the value N of said digital input signal; and control means associated with said first and second capacitor groups respectively, for responding to said digital signals and providing respective control signals to said selection means.

8. A circuit for use in digital-to-analog converters and analog-to-digital converters, said circuit comprising:

a first array of capacitors having substantially identical value arranged in a predetermined layout, each capacitor in said first array having first and second terminals, each of said first terminals being commonly connected;

a second array of capacitors having substantially identical value arranged in a predetermined layout, each capacitor in said second array having first and second terminals, each of said first terminals being commonly connected;

logic means responsive to a digital input signal having a value N for providing first and second logic control signals having values which when summed equals N; and first and second selection means, each including a plurality of switches individually connected to the switched terminals of the capacitors of said first and second arrays for selectively connecting the terminals to first or second voltages, for switching a respective predetermined number of capacitors in said first and second arrays in a predetermined sequence from first to said second voltages as a function of said first and second logic control signals, said predetermined sequences and said predetermined layouts cooperating to maintain the geometrical centroid of the switched capacitors of said circuit at a substantially constant location.

9. A circuit for reducing differential nonlinearities in switched element arrays employed in digital-to-analog and analog-to-digital converters, said circuit comprising:

decoding logic circuitry, responsive to a digital input signal, for providing a first and second logic control signals representative of said digital input signal and having values, which when summed, equals the value of the input signal;

a first switched element array having a first predetermined layout and having capacitors of substantially equal value;

a second switched element array having a second predetermined layout and having capacitors of substantially equal value;

gating logic circuitry coupled between said decoding logic circuitry and each element of said first and second switched element arrays for sequentially switching selected ones of the elements in said first and second arrays in a predetermined sequence from first to second voltages as a function of said first and second logic control signals, said predetermined sequences and said predetermined layouts cooperating to maintain the geometrical centroid of the switched elements of said circuit at a substantially constant location irrespective of the number of elements switched at any one time.

* * * * *